United States Patent [19]

Yamada

[11] Patent Number: 5,397,933

[45] Date of Patent: Mar. 14, 1995

[54] LASER DIODE DRIVING CIRCUIT HAVING A TEMPERATURE COMPENSATION CIRCUIT

[75] Inventor: Tsutomu Yamada, Tokyo, Japan

[73] Assignee: Ando Electric Co., Ltd., Tokyo, Japan

[21] Appl. No.: 96,052

[22] Filed: Jul. 22, 1993

[30] Foreign Application Priority Data

Jul. 24, 1992 [JP] Japan .................................. 4-217513

[51] Int. Cl.6 ............................................. H03K 5/00
[52] U.S. Cl. ..................................... 327/109; 327/513; 327/514
[58] Field of Search ..................... 307/270, 317.1, 311, 307/310; 346/160

[56] References Cited

U.S. PATENT DOCUMENTS

| | | | |
|---|---|---|---|
| 3,192,405 | 6/1965 | Patchell | 307/317.1 |
| 3,300,733 | 1/1967 | Price | 307/317.1 |
| 3,808,461 | 4/1974 | Maximov et al. | 307/317.1 |
| 4,196,381 | 4/1980 | Standing | 307/317.1 |

Primary Examiner—Steven L. Stephan
Assistant Examiner—Shawn Riley
Attorney, Agent, or Firm—Flynn, Thiel, Boutell & Tanis

[57] ABSTRACT

A laser diode driving circuit having a temperature compensation circuit capable of keeping an optical output produced from a laser diode constant relative to the change of temperature. A transistor is connected in series to the laser diode wherein the former controls a forward current to be applied to the latter. A first variable resistor, an FET and a second variable resistor are connected in series to one another and also connected in parallel to the laser diode and the transistor. A node between the first variable resistor and the FET is connected to the base of the transistor. The FET and the second variable resistor constitute a constant current circuit wherein a circuit current, in response to the change of the voltage caused by temperature change applied to the base of the transistor, is set by the second variable resistor to thereby control the output current of the transistor so as to keep the optical output of the laser diode constant.

3 Claims, 2 Drawing Sheets

LASER DIODE DRIVING CIRCUIT HAVING A TEMPERATURE COMPENSATION CIRCUIT

BACKGROUND OF THE INVENTION

1. Field of the Invention

The present invention relates to a laser diode driving circuit having a temperature compensation circuit for keeping an optical output constant relative to the change of temperature.

2. Prior Art

FIG. 2 shows a conventional laser diode driving circuit having a temperature compensation circuit. Denoted at 1 is a laser diode (hereinafter referred to as an LD), 2 is a transistor (hereinafter referred to as a TR) for driving the LD 1, 6 is a photodiode, 7 is a differential amplifier, 8 is a reference power supply and 9 is a monitor light.

The monitor light 9 emitted by the LD 1 is detected by the photodiode 6 and the output power of the monitor light 9 is converted into an electric signal the magnitude of which is compared by the differential amplifier 7 with a reference voltage of the reference power supply 8 which is set beforehand at a certain temperature wherein the result of comparison is fed back to the TR 2 so as to control the output current of the TR 2 whereby the optical output from the LDI is kept constant. In FIG. 2, a feedback circuit is formed of the LD 1, the photodiode 6, the differential amplifier 7, the TR 2 and the LD 1.

SUMMARY OF THE INVENTION

It is an object of the present invention to provide a laser diode driving circuit having a temperature compensation circuit capable of producing an optical output which is constant relative to the change of temperature from an LD and comprising a first variable resistor, an FET and a second variable resistor which are connected in series to one another and also connected in parallel to the LD and a TR wherein the FET and the second variable resistor constitute a constant current circuit for setting a circuit current in response to the change of temperature and wherein the first variable resistor converts the circuit current into a voltage to be applied to the base of the TR so that a forward current is supplied to the LD from the TR to keep the optical output of the LD constant.

To achieve the object of the invention, the present invention comprises a laser diode 1, a TR 2 connected in series to the laser diode 1 for supplying a forward current to the laser diode 1, a first variable resistor 3, an FET 4 and a second variable resistor 5 being connected in series to one another and connected in parallel to the laser diode 1 and TR 2, wherein a node between the first variable resistor 3 and the FET 4 is connected to the base of the TR 2 and the FET 4 and the second variable resistor 5 constitute a constant current circuit, characterized in that the second variable resistor 5 sets the circuit current in response to the change of temperature of the base of the TR 2 and the first variable resistor 3 converts the circuit current into the voltage to be applied to the base of the TR 2 to thereby control the output current of the TR 2 so as to keep the optical output of the laser diode I constant relative to the change of temperature.

DETAILED DESCRIPTION

A preferred embodiment of a laser diode driving circuit having a temperature compensation circuit will be described with reference to FIG. 1.

Denoted at 3 is a first variable resistor, 4 is an FET and 5 is a second variable resistor. An LD 1 and a TR 2 are the same as those in FIG. 2. The first variable resistor 3, the FET and the second variable resistor 5 are connected in series to one another and are also connected in parallel to the LD 1 and the TR 2 and a node between the first variable resistor 3 and the FET 4 is connected to the base of the TR 2.

Figure 1:
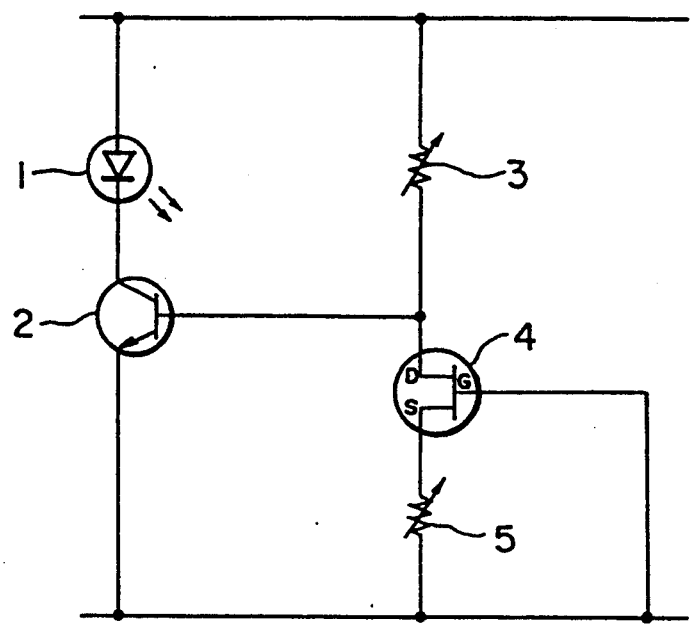
FIG. 1 shows an arrangement of a laser diode driving circuit having a temperature compensation circuit according to a preferred embodiment of the present invention.
Figure 2:
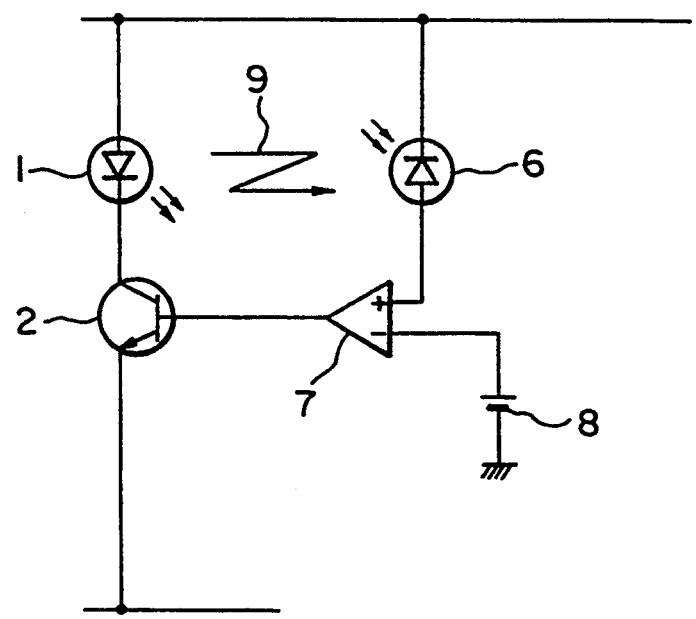
FIG. 2 shows an arrangement of a conventional laser diode driving circuit having a temperature compensation circuit.

That is, the first variable resistor 3, the FET 4 and the second variable resistor 5 in FIG. 1 replace the photodiode 6, the differential amplifier 7 and the reference power supply 8 in FIG. 2.

The FET 4 and the second variable resistor 5 constitute a constant current circuit wherein the second variable resistor 5 sets a circuit current of the constant current circuit and the first variable resistor 3 sets the voltage to be applied to the base of TR 2 to thereby control the output current of the TR 2.

The relation between the circuit current of the constant current circuit, which is composed of the FET 4 and the variable resistor 5, and the temperature will be described with reference to FIG. 3, in which a vertical axis represents the circuit current and the horizontal axis represents temperature. Data 11 to 13 represent temperature characteristics of the circuit current wherein the data 11 has the circuit current of 1.2 mA, the data 12 has the circuit current of 2 mA and the data 13 has the circuit current of 2.8 mA respectively at the ambient temperature of 25° C.

The change of the circuit current caused by temperature change in the constant current circuit composed of the FET 4 and the variable resistor 5 represents a positive or negative linear temperature characteristic in the saturation region of the FET 4 and the inclination of the change of temperature is determined by the circuit current. The change of the circuit current caused by temperature change is converted by the first variable resistor 3 into the change of the voltage to be applied to the base of the TR 2 and also converted into the change of the output current to be produced from the TR 2.

Figure 4:
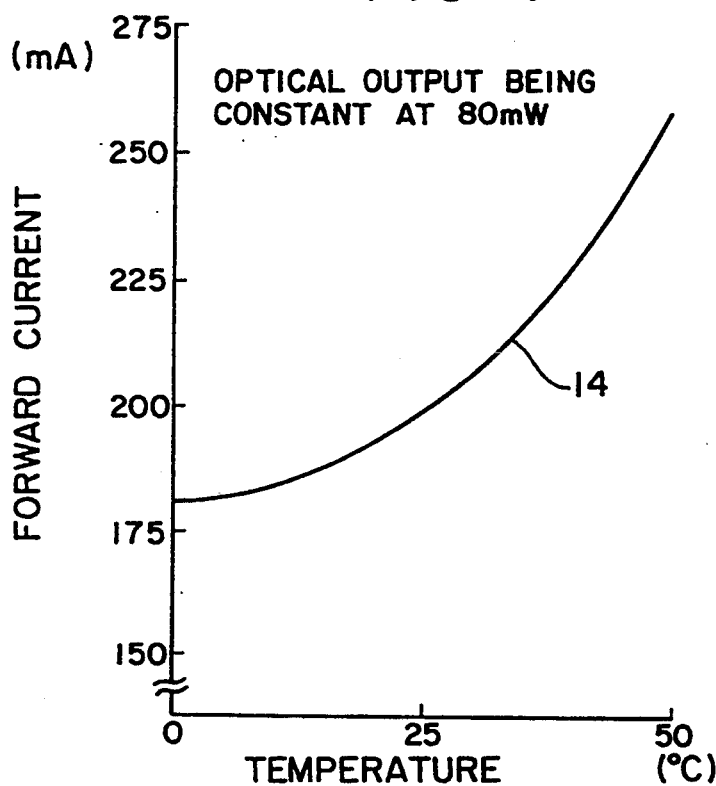
FIG. 4 is a graph showing a forward current for keeping an optical output of an LD constant versus temperature property.

Successively, the forward current versus temperature characteristic provided that the optical output of the LD 1 is constant will be described with reference to FIG. 4 in which a vertical axis represents the forward current and a horizontal axis represents temperature. FIG. 4 exemplifies a data 14 when the optical output of the LD 1 is kept constant at 80 mW. A driving current which is shown as the data 14 in FIG. 4 should be supplied from the TR 2 to the LD 1 so as to keep the optical output constant relative to the change of temperature.

Figure 3:
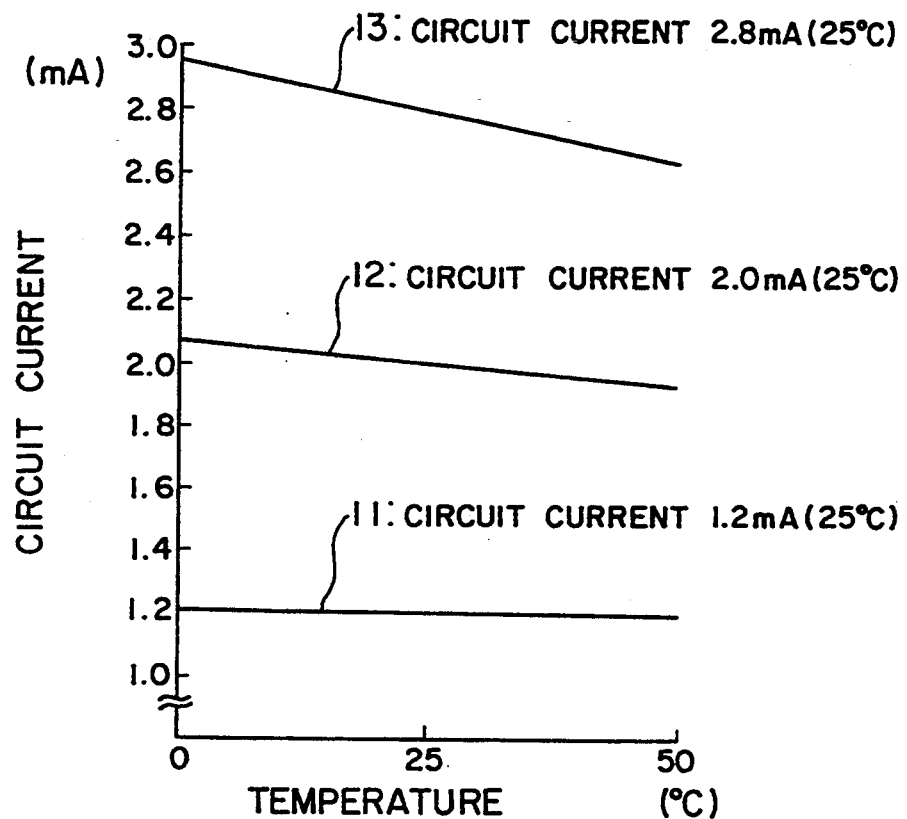
FIG. 3 is a graph showing a circuit current produced by a constant current circuit composed of an FET and a variable resistor versus temperature property.

The present invention is characterized by previously measured data 14 in FIG. 4, obtaining the change of the voltage applied to the base of the TR 2 forming a curve 5 in FIG. 4 by experiment or calculation, converting the thus obtained change of the voltage applied to the base of the TR 2 into the change of temperature of the circuit current of the constant current circuit comprising the FET 4 and the variable resistor 5, obtaining the circuit current representing the change of temperature of the circuit current from FIG. 3, setting the thus obtained circuit current by the variable resistor 5, converting the set circuit current into the voltage to be applied to the base of the TR 2 by the variable resistor 3, thereby providing the change of temperature of the bias, which is approximate the curve of data 14 in FIG. 4, to the LD.

According to the present invention, the first variable resistor 3, the FET 4 and the second variable resistor 5 are connected in series and are also connected in parallel to the LDI and the TR 2 wherein the FET 4 and the second variable resistor 5 constitute the constant current circuit for setting the circuit current in response to the change of temperature and wherein the first resistor converts the circuit current into the voltage to be applied to the base of the TR 2 so that the TR 2 can supply the forward current to the LDI for keeping the optical output constant. Accordingly, a constant optical output can be produced from the LDI.

What is claimed is:

1. A laser diode driving circuit having a temperature compensation circuit, comprising:

a transistor connected in series to a laser diode for supplying a forward current to said laser diode;

a first variable resistor, a FET and a second variable resistor connected in series to one another and in parallel to said laser diode and transistor, a node between said first variable resistor and said FET being connected to a base of said transistor, and said FET and said second variable resistor constituting a constant current circuit; and said second variable resistor sets the circuit current in response to a change of voltage of the base of said transistor caused by temperature change and said first variable resistor converts the circuit current into the voltage to be applied to the base of said transistor to thereby control the output current of said transistor so as to maintain the optical output of said laser diode constant relative to the change of temperature.

2. A laser diode driving circuit capable of compensating for changes in temperature, comprising:

1) a first circuit including a transistor connected in series with a laser diode for driving said diode, said transistor supplying a forward current to said diode;

2) a second circuit connected in parallel to said first circuit, said second circuit including:
   a) a first variable resistor,
   b) a FET connected in series with said first variable resistor,
   c) a second variable resistor connected in series with said FET and first variable resistor, and
   d) a node between said first variable resistor and said FET being connected to a base of said transistor of said first circuit; and 3) said FET and said second variable resistor of said second circuit constituting a constant current circuit which varies an output current in response to changes in voltage at the base of said transistor caused by temperature fluctuations, whereby said first variable resistor converts said output current into a voltage applied to the base of said transistor so as to maintain an output of said laser diode constant relative to changes in temperature.

3. A laser diode driving circuit according to claim 2, wherein said FET is connected in series between said first and second variable resistors.

* * * * *